United States Patent [19]

Jungroth et al.

[11] Patent Number: 5,363,335
[45] Date of Patent: Nov. 8, 1994

[54] NONVOLATILE MEMORY WITH AUTOMATIC POWER SUPPLY CONFIGURATION

[75] Inventors: Owen Jungroth, Sonora; Thomas C. Price, Fair Oaks, both of Calif.

[73] Assignee: Intel Corporation, Santa Clara, Calif.

[21] Appl. No.: 127,943

[22] Filed: Sep. 28, 1993

[51] Int. Cl.$^5$ ............................................. G11C 13/00
[52] U.S. Cl. ................... 365/226; 365/189.09; 365/227
[58] Field of Search ............... 365/226, 189.09, 228, 365/227, 900; 307/296.01, 296.08

[56] References Cited

U.S. PATENT DOCUMENTS

| | | |
|---|---|---|
| 4,870,298 | 9/1989 | Telefus . |
| 5,172,342 | 12/1992 | Gochi ................................. 365/226 |
| 5,193,198 | 3/1993 | Yokouchi ...................... 365/226 X |
| 5,216,588 | 6/1993 | Bajwa et al. .................... 365/226 X |
| 5,267,218 | 11/1993 | Elbert ................................ 365/226 |

Primary Examiner—Eugene R. LaRoche
Assistant Examiner—Son Mai
Attorney, Agent, or Firm—Blakely, Sokoloff, Taylor & Zafman

[57] ABSTRACT

A nonvolatile memory is described that includes a memory array and control circuitry coupled to the memory array for controlling memory operations with respect to the memory array. The control circuitry can operate at a first power supply voltage and a second power supply voltage. A configuration circuit is coupled to receive a power supply voltage indication signal for selectively configuring the control circuitry in accordance with the power supply indication signal to operate at one of the first and second power supply voltages. When the power supply voltage indication signal is in a first state, the configuration circuit configures the control circuitry to operate at the first power supply voltage. When the power supply voltage indication signal is in a second state, the configuration circuit configures the control circuitry to operate at the second power supply voltage. A method for automatically configuring a nonvolatile memory with respect to the voltage level of a power supply applied to the nonvolatile memory is also described. The power supply can be in a first voltage level and a second voltage level.

18 Claims, 7 Drawing Sheets

| $\overline{PWD}$ | CAM1 | CAM2 | 3/$\overline{5}$ PIN | $\overline{PIN35}$ | $\overline{35PINE}$ | 5VSYSTEM | FLASH EPROM |
|---|---|---|---|---|---|---|---|
| 1 | 0 | 0 | 0 | 1 | 0 | 1 | 5.0V SYSTEM (FROM 3/$\overline{5}$ PIN) |
| 1 | 0 | 0 | 1 | 0 | 0 | 0 | 3.3V SYSTEM (FROM 3/$\overline{5}$ PIN) |
| 1 | 0 | 1 | X | X | 1 | 0 | 3.3 VOLT SYSTEM ALWAYS |
| 1 | 1 | 0 | X | X | 1 | 1 | 5.0 VOLT SYSTEM ALWAYS |
| 1 | 1 | 1 | X | X | 1 | 1 | RESERVED FOR FUTURE USE |
| 0 | X | X | X | X | 1 | 1 | POWER DOWN |

X MEANS "DO NOT CARE."

Figure 7

NONVOLATILE MEMORY WITH AUTOMATIC POWER SUPPLY CONFIGURATION

FIELD OF THE INVENTION

The present invention pertains to the field of computer memories. More particularly, this invention relates to an electrically erasable and programmable floating gate nonvolatile memory with automatic power supply configuration.

BACKGROUND OF THE INVENTION

One type of prior nonvolatile memory is the flash erasable and electrically programmable read-only memory ("flash EPROM"). The flash EPROM can be programmed by a user. Once programmed, the entire contents of the flash EPROM can be erased by electrical erasure. The flash EPROM may then be reprogrammed with new data.

Like the prior art personal computer systems, one type of prior flash EPROM is typically designed to be used in the 3 volt power supply environment ("3 volt flash EPROM"). Another type of prior flash EPROM is typically designed to be used in the 5 volt power supply environment ("5 volt flash EPROM"). The 3 volt flash EPROM is typically used in the 3 volt power supply prior art personal computers and the 5 volt flash EPROM is typically used in the 5 volt power supply prior art personal computers. Many prior art desk-top computers typically employ a 5 volt power supply and many prior art laptop computers typically employ a 3 volt power supply.

One disadvantage associated with such prior flash EPROMs is that a 5 volt flash EPROM is typically unsuitable for use in a 3 volt power supply personal computer and a 3 volt flash EPROM is typically unsuitable for use in a 5 volt power supply personal computer. Mismatching the power supply of a flash EPROM with that of a personal computer typically causes the flash EPROM to operate incorrectly and, in the worst case, can cause damage to data stored in the flash EPROM. Therefore, before installing a prior flash EPROM into a personal computer, the user typically needs to know the voltage of the power supply of the personal computer and the voltage required by the flash EPROM.

Another disadvantage associated with the prior flash EPROMs is that the prior flash EPROMs typically cannot be switched between different power supply systems. Typically, when a 5 volt flash EPROM is removed from a 5 volt power supply system and placed in a 3 volt power supply system, the 5 volt flash EPROM typically cannot function properly and the data stored in that flash EPROM may be lost. Likewise, when a 3 volt flash EPROM is removed from a 3 volt power supply system and placed in a 5 volt power supply system, the 3 volt flash EPROM typically cannot function properly and the data stored may be lost. Moreover, the circuitry of flash EPROM may be damaged.

SUMMARY AND OBJECTS OF THE INVENTION

One of the objects of the present invention is to provide a reprogrammable nonvolatile memory that can be used with different power supply voltages.

Another object of the present invention is to provide a reprogrammable nonvolatile memory that can automatically configure itself to operate at the power supply voltage to which the memory is currently connected.

Another object of the present invention is to provide a reprogrammable nonvolatile memory that is fully interchangeable among different power supply voltages.

A nonvolatile memory is described that includes a memory array and control circuitry coupled to the memory array for controlling memory operations with respect to the memory array. The control circuitry can operate at a first power supply voltage and a second power supply voltage. A configuration circuit is coupled to receive a power supply voltage indication signal for selectively configuring the control circuitry in accordance with the power supply voltage indication signal to operate at one of the first and second supply voltages. When the power supply voltage indication signal is in a first state, the configuration circuit configures the control circuitry to operate at the first power supply voltage. When the power supply voltage indication signal is in a second state, the configuration circuit configures the control circuitry to operate at the second power supply voltage.

A method for automatically configuring a nonvolatile memory with respect to the voltage level of a power supply applied to the nonvolatile memory is also described. The power supply can be in a first voltage level and a second voltage level. A power supply voltage indication signal is first received in a configuration circuit. The power supply voltage indication signal indicates the voltage level of the power supply applied to the nonvolatile memory. The power supply voltage indication signal is in a first state when the power supply has the first voltage level and is in a second state when the power supply has the second voltage level. The nonvolatile memory is then configured by the configuration circuit in accordance with the power supply voltage indication signal to operate with respect to one of the first and second voltage levels of the power supply that is applied to the control circuitry. When the power supply voltage indication signal is in the first state, the configuration circuit then (1) causes each of a plurality of input buffers of the control circuitry to have a first device size ratio for a trip point that is associated with the first voltage level of the power supply, (2) causes an output compensation circuit in each of a plurality of output buffers of the control circuitry to be turned off, (3) causes a boost circuit of the control circuitry to boost the first voltage level of the power supply applied to a selected word line of the memory array during a read operation of the memory array to the second voltage level, and (4) causes a memory operation control engine of the control circuitry to select a first memory operation control algorithm associated with the first voltage level of the power supply. When the power supply voltage indication signal is in the second state, the configuration circuit then (5) causes each of the plurality of input buffers of the control circuitry to have a second device size ratio for the trip point that is associated with the second voltage level of the power supply, (6) causes the output compensation circuit in each of the plurality of output buffers of the control circuitry to be turned on, (7) causes the boost circuit of the control circuitry to be turned off, and (8) causes the memory operation control engine of the control circuitry to select a second memory operation control algorithm associated with the second voltage level of the power supply.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
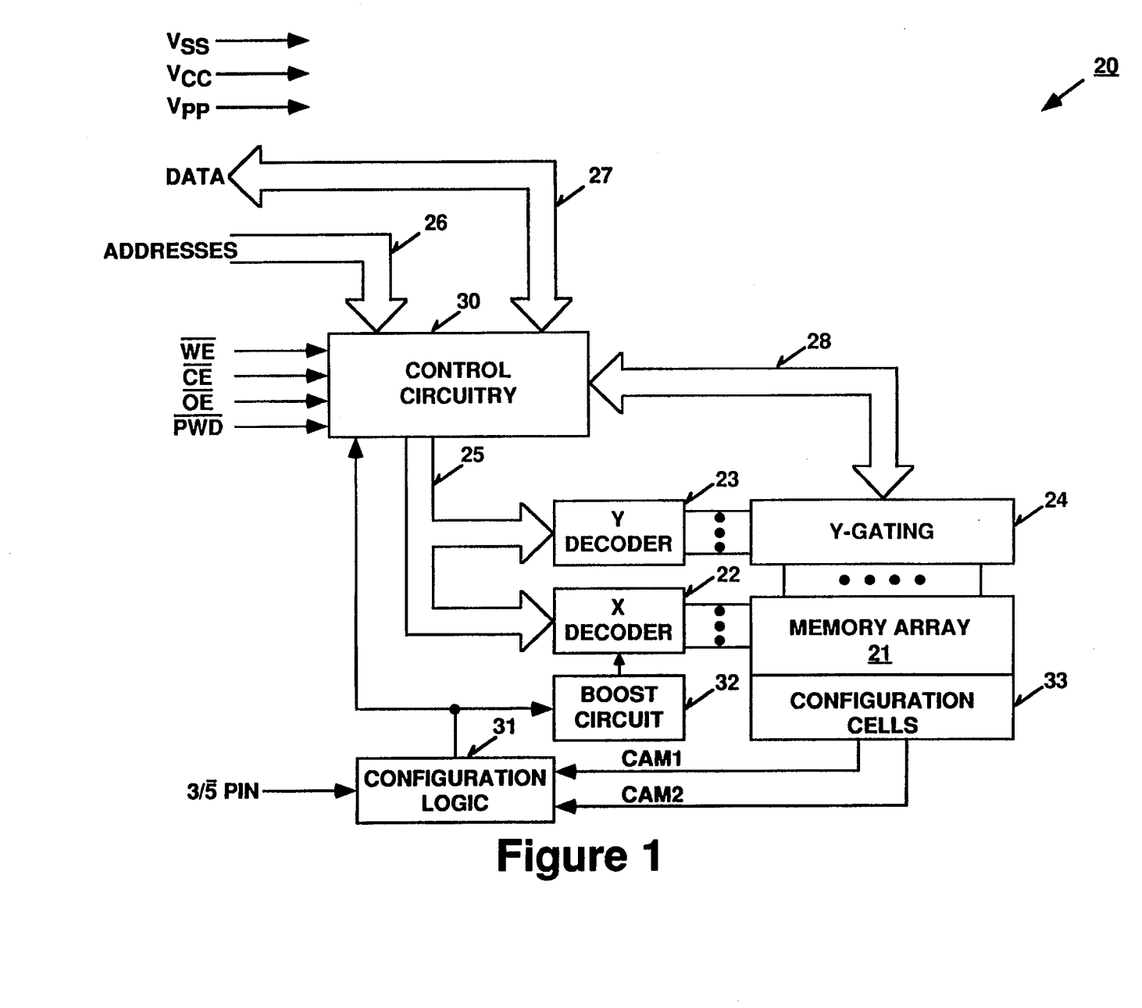
FIG. 1 is a block diagram of a flash EPROM, including control circuitry, a boost circuit, a configuration logic, and configuration cells.

FIG. 1 is a block diagram of the circuitry of flash EPROM 20, which implements an embodiment of the present invention. Flash EPROM 20 includes a memory array 21, which is made up of floating gate flash EPROM cells that store data at addresses. For one embodiment, memory array 21 stores 16 Mbits ("Megabytes") of data. For alternative embodiments, memory array 21 can be smaller than or larger than 16 Mbits.

Flash EPROM 20 can be used in any kind of computer systems or data processing systems. For one embodiment, flash EPROM 20 employs MOS circuitry and all the circuitry of flash EPROM 20 resides on a single substrate.

Flash EPROM 20 includes an X decoder 22 and a Y decoder 23 coupled to memory array 21. X decoder 22 is the row decoder of memory array 21 and Y decoder 23 is the column decoder of memory array 21. X decoder 22 is coupled to the word lines of memory array 21 and Y decoder 23 is coupled to the bit lines of memory array 21 via a Y gating 24. X and Y decoders 22-23 receive the respective X and Y addresses via bus 25.

Flash EPROM 20 also includes control circuitry 30. Control circuitry 30 controls the memory operations of flash EPROM 20. The memory operations include read, programming, and erasure operations. Control circuitry 30 receives data read from memory array 21 and applies data to be written into memory array 21 via bus 28. Control circuitry 30 applies the respective X and Y addresses to X and Y decoders 22-23, respectively, via bus 25. Control circuitry 30 receives addresses from external circuitry (not shown) via address bus 26. Control circuitry 30 also receives the data to be written to memory array 21 from the external circuitry and sends the data read from memory array 21 to the external circuitry via data bus 27. Data bus 27 also supplies the device operation commands to control circuitry 30.

Control circuitry 30 receives four control signals. These control signals are a chip enable control signal $\overline{CE}$, an output enable control signal $\overline{OE}$, a write enable control signal $\overline{WE}$, and a power down control signal $\overline{PWD}$. The chip enable $\overline{CE}$ signal is the power control signal for flash EPROM 20 and is used for device selection of flash EPROM 20. The output enable $\overline{OE}$ signal is the output control for flash EPROM 20 and is used to gate data from the output pins of flash EPROM 20, dependent on device selection. Both of the control signals $\overline{CE}$ and $\overline{OE}$ must be logically active to obtain data at the outputs of flash EPROM 20.

The write enable control signal $\overline{WE}$ allows writes to control circuitry 30 while the chip enable control signal $\overline{CE}$ is active low. The write enable signal $\overline{WE}$ is an active low signal. Addresses and data are latched into control circuitry 30 on the rising edge of the write enable control signal $\overline{WE}$. Standard microprocessor timings are used.

The $\overline{PWD}$ control signal is an active low power down control signal. A logical low $\overline{PWD}$ signal causes flash EPROM 20 to enter the power down mode. When flash EPROM 20 enters the power down mode, all circuits of flash EPROM 20 are powered off. Flash EPROM 20 returns to its normal operational modes when the $\overline{PWD}$ control signal rises to logical high. For another embodiment, the $\overline{PWD}$ control signal may also include a high voltage signal.

For alternative embodiments, flash EPROM 20 may function without some of the above-mentioned control signals.

$V_{PP}$ is the program/erase power supply voltage for flash EPROM 20. $V_{CC}$ is the device power supply voltage for flash EPROM 20 and $V_{SS}$ is ground. For one embodiment, $V_{PP}$ is approximately 12 volts.

$V_{CC}$ can be selected from a number of power supply voltages. For one embodiment, $V_{CC}$ can be at approximately either 5 volts or 3.3 volts. For alternative embodiments, $V_{CC}$ can be selected from more than two power supply voltages.

Figure 2:
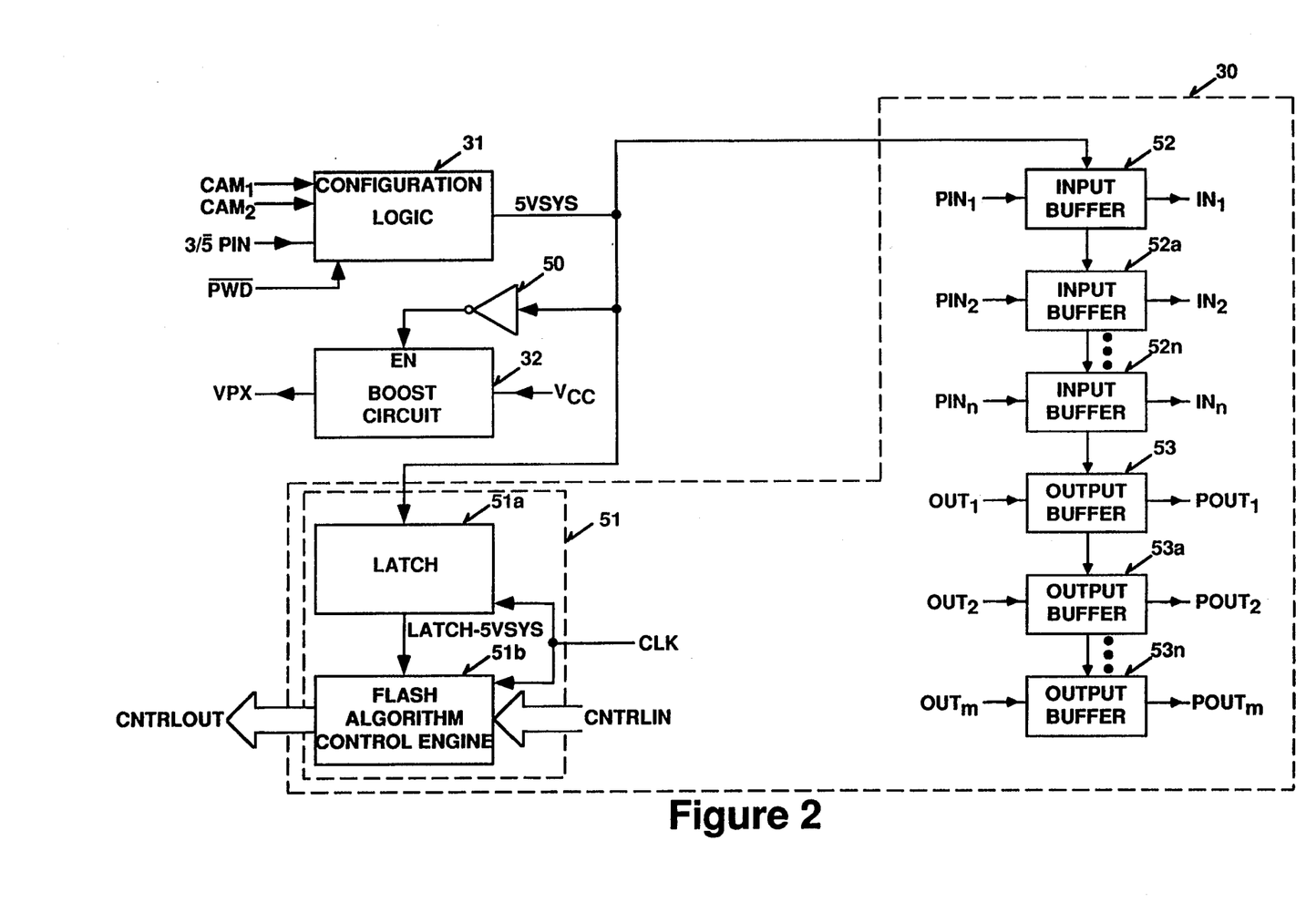
FIG. 2 is a block diagram of the control circuitry, the boost circuit, and the configuration logic of FIG. 1.

Referring now to FIG. 2, a portion of control circuitry 30 is shown in more detail. As can be seen from FIG. 2, control circuitry 30 includes a flash algorithm control circuit 51 and a plurality of input and output buffers 52 through 52n and 53 through 53n. Control circuitry 30 also includes other circuits. Those other circuits of control circuitry 30 are not shown in FIG. 2 for purposes of simplicity.

Each of input buffers 52-52n is connected to an input pin of flash EPROM 20 for buffering an input signal of flash EPROM 20. Each of input buffers 52-52n converts the voltage level of each of the input signals applied to the input pins of flash EPROM 20 from TTL voltage level to CMOS voltage level. Each of output buffers 53-53n is connected to an output pin of flash EPROM 20 for buffering an output signal to the respective output pin.

Flash algorithm control circuit 51 includes a flash algorithm control engine 51b and a latch 51a. Control engine 51b receives control signals CNTRLIN from the other circuits (not shown) of control circuitry 30 and generates the appropriate control signals CNTRLOUT to other parts of flash EPROM 20 of FIG. 2. Control engine 51b generates the appropriate pulses to control the memory operations of flash EPROM 20. Control engine 51b includes and implements algorithms to generate the appropriate pulses to control the programming and erasure operations of flash EPROM 20. As will be described in more detail below, the width of the programming and erasure pulses generated by control engine 51b varies with respect to the voltage level of the power supply voltage $V_{CC}$. In order to make the pulse width of the pulse the same for various power supply voltages, different algorithms are implemented in control engine 51b, each for one of the different power supply voltages.

For one embodiment, control engine 51b includes a first programming and erasure algorithm for flash EPROM 20 with respect to a 5 volt power supply and a second programming and erasure algorithm for flash EPROM 20 with respect to a 3.3 volt power supply. For alternative embodiments, control engine 51b may include more than two programming and erasure algorithms, each corresponding to one power supply voltage that may be applied to flash EPROM 20.

The selection of the appropriate programming and erasure algorithm in control engine 51b with respect to the power supply $V_{CC}$ is controlled by a LATCH5VSYS signal from latch 51a. The LATCH5VSYS signal is a synchronized signal with the clock signal CLK applied to latch 51a and control engine 51b. Control engine 51b operates synchronously with the CLK clock signal. The CLK clock signal is generated by the other circuits of control circuitry 30. Because control engine 51b is a synchronous system, the LATCH5VSYS signal needs to be a synchronous signal. The synchronous operation of the LATCH5VSYS signal is achieved in latch 51a.

Latch 51a receives a 5VSYS signal which will be described in more detail below. Latch 51 a then synchronizes the 5VSYS signal with the CLK clock signal to generate the LATCH5VSYS signal. Therefore, the LATCH-5VSYS signal is the synchronized signal of the 5VSYS signal.

Under the control of the LATCH5VSYS signal, control engine 51b selects the appropriate programming and erasure algorithm and generates the control signals CNTRLOUT in accordance with the selected algorithm to control the memory operations of flash EPROM 20. Control engine 51b regulates the programming and erasure operations in accordance with the selected algorithm, including program pulse width and repetition where required and internal verification and margin of data. Whether control engine 51b causes flash EPROM 20 to undergo a programming or erasure operation depends on the control signals CNTRLIN applied to the input of control engine 51b.

As described above, each of input buffers 52-52n receives an input signal via one of the input pins of flash EPROM 20. As can be seen from FIG. 2, each of input buffers 52-52n receives one of input signals $PIN_1$ through $PIN_n$. The $PIN_1$-$PIN_n$ signals represent the data and commands applied to the data pins of flash EPROM 20, the addresses applied to the address pins of flash EPROM 20, and the control signals $\overline{WE}$, $\overline{OE}$, $\overline{CE}$, and $\overline{PWD}$ applied to their respective pins of flash EPROM 20. Input buffers 52-52n buffer the input signals $PIN_1$-$PIN_n$ and output respective $IN_1$ through $IN_n$ signals to the other circuits of control circuitry 30 and to X and Y decoders 22-23 and memory array 21 of FIG. 1. In other words, the $IN_1$-$IN_n$ signals are the buffered signals of the $PIN_1$-$PIN_n$ signals applied to the input pins of flash EPROM 20.

As also can be seen from FIG. 2, each of output buffers 53-53n receives one of output signals $OUT_1$ through $OUT_m$. Output buffers 53-53n then buffer the $OUT_1$-$OUT_m$ signals and generate the output pin signals $POUT_1$ through $POUT_m$. The output pin signals $POUT_1$-$POUT_m$ are then coupled to the external circuitry via the output pins of flash EPROM 20. The $POUT_1$-$POUT_m$ signals are therefore buffered signals of the output signals $OUT_1$-$OUT_m$.

Referring now back to FIG. 1, flash EPROM 20 also includes a configuration logic 31 and a boost circuit 32. Configuration logic 31 is the power supply configuration logic of flash EPROM 20 and is used to configure flash EPROM 20 with respect to the voltage level of the power supply voltage $V_{CC}$ applied to flash EPROM 20. Configuration logic is connected to control circuitry 30 and boost circuit 32. Boost circuit 32 is connected to a selected word line of memory array 21 via X decoder 22 during the read operation of flash EPROM 20. X decoder 22 selects the selected word line for every X address applied.

The function of boost circuit 32 is to boost the power supply voltage $V_{CC}$ applied to the selected word line to a required voltage level during a read operation of memory array 21 when the $V_{CC}$ voltage is not equal to the required voltage. For example, when a 5 volt gate voltage is required for the selected word line of memory array 21 during the read operation and the power supply voltage $V_{CC}$ applied to the $V_{CC}$ pin of flash EPROM 20 is only 3.3 volts, the 3.3 volt $V_{CC}$ voltage cannot be directly applied as the gate voltage to the selected word line via X decoder 22 during the read operation of memory array 21. In this situation, boost circuit 32 is used to boost the 3.3 volt power supply voltage to 5 volts.

Configuration logic 31 controls when boost circuit 32 should be in operation. Flash EPROM 20 also includes a 3/5 pin that supplies a 3/5PIN signal to configuration logic 31. The 3/5PIN signal is a power supply voltage indication signal that indicates the voltage level of the power supply $V_{CC}$ to flash EPROM 20. For example, when the power supply $V_{CC}$ applied to flash EPROM 20 is at 5 volts, the 3/5PIN signal is at logic low state. When the voltage level of the power supply VCC applied to flash EPROM 20 is at 3.3 volts, the 3/5PIN signal applied to the 3/5pin of flash EPROM 20 is at logical high state. For alternative embodiments, the 3/5PIN signal can have more than two states, each indicating one of the power supply voltages that may be applied to flash EPROM 20 at the $V_{CC}$ pin. For alternative embodiments, the 3/5PIN signal is applied to flash EPROM 20 via a member of pins of flash EPROM 20.

For one embodiment, the 3/5PIN signal is supplied to the 3/5pin of flash EPROM 20 from the external circuitry. For another embodiment, flash ERPOM 20 does not have the 3/5pin. Instead, configuration logic 31 receives the 3/5PIN signal from a voltage detector (not shown in FIG. 1) of flash EPROM 20 that is connected to the $V_{CC}$ pin of flash PROM 20 and configuration logic 31. The voltage detector detects the voltage level of the $V_{CC}$ power supply applied at the $V_{CC}$ pin of flash EPROM 20 and then generates the appropriate power supply voltage indication signal 3/5PIN to configuration logic 31 in accordance with the voltage level detected.

Configuration logic 31 configures flash EPROM 20 to operate with respect to the voltage level of the power supply $V_{CC}$ of flash EPROM 20 in accordance with the power supply voltage indication 3/5PIN signal. For example, when the 3/5PIN signal indicates that the $V_{CC}$ power supply of flash EPROM 20 is at 3.3 volts, configuration logic 31 configures flash EPROM 20 to be a 3.3 volt flash EPROM. When the 3/5PIN signal indicates that the $V_{CC}$ power supply of flash EPROM 20 is at 5 volts, configuration logic 31 configures flash EPROM 20 to be a 5 volts flash EPROM. Configure logic 31 configures control circuitry 30 and boost circuit 32 such that flash EPROM 20 is configured with respect to the power supply voltage $V_{CC}$. The function of configuration logic 31 to configure control circuitry 30 and to control boost circuit 32 such that flash EPROM 20 is configured with respect to the power supply voltage $V_{CC}$ will be described in more detail below, in conjunction with FIGS. 2–7.

Flash EPROM 20 also includes configuration cells 33. Configuration cells 33 are located peripherally to memory array 21. Each of configuration cells 33 is a flash EPROM-type cell that can be electrically programmed and erased. Configuration cells 33 are not accessible by an end user and can only be accessed in a test mode of flash EPROM 20. Configuration cells 33 are used in flash EPROM 20 to configure flash EPROM 20 with respect to the power supply. For example, configuration cells 33 can configure flash EPROM 20 to be a 3.3 volt flash EPROM or a 5 volt flash EPROM, regardless of the power supply voltage indication 3/5PIN signal. As a further example, configuration cells 33 can configure flash EPROM 20 such that flash EPROM 20 is configured in accordance with the power supply voltage indication 3/5PIN signal. Configuration cells 33 generate a $CAM_1$ control signal and a $CAM_2$ control signal to configuration logic 31.

For one embodiment, configuration cells 33 include two configuration cells. For alternative embodiments, configuration cells 33 may include more than two configuration cells to configure flash EPROM 20 with respect to the power supply.

Flash EPROM 20 may also include other configuration cells (not shown). These other configuration cells are also located peripherally to memory array 21. These other configuration cells store various configuration information of flash EPROM 20. The other configuration cells are also flash EPROM-type cells.

Referring now to FIGS. 1 and 2, the configuration of flash EPROM 20 with respect to the 3/5PIN signal and the $CAM_1$ and $CAM_2$ signals is now described in more detail below. As can be seen from FIG. 2, configuration logic 31 generates the 5VSYS signal which is used to configure control circuitry 30 and to control boost circuit 32. As described above and for one embodiment, the 3/5PIN signal indicates the power supply voltage $V_{CC}$ applied to flash EPROM 20 is at 3.3 volts or 5 volts. For this embodiment, the 5VSYS signal is used to center the trip point of the circuit of each of input buffers 52-52n with respect to the power supply voltage $V_{CC}$ such that the trip point of each of input buffers 52-52n is valid for the input signal of the circuit when the power supply $V_{CC}$ voltage changes. As is known, the trip point of an input buffer varies with respect to the power supply voltage VCC applied to the buffer. By using the 5VSYS signal to modify the circuit, the correct TTL trip point for both the 3.3 volt power supply and the 5 volt power supply is obtained. The circuit of each of input buffers 52-52n and the operation of the 5VSYS signal to modify the circuit with respect to the voltage level of the power supply voltage $V_{CC}$ will be described in more detail below, in conjunction with FIG. 4.

The 5VSYS signal also controls each of output buffers 53-53n to operate at either the 3.3 volt power supply or the 5 volt power supply. As will be described in more detail below in connection with FIG. 5, each of output buffers 53-53n includes an output compensation circuit and a buffer circuit. The function of the output compensation circuit is to lower the noise occurred in the buffer circuit when the power supply voltage $V_{CC}$ is at 5 volts. The higher the power supply voltage $V_{CC}$, the higher the noise the circuit has. When the power supply $V_{CC}$ applied to flash EPROM 20 is at 3.3 volts, the 5VSYS signal disables the compensation circuit in each of output buffers 53-53n such that each of output buffers 53-53n are set for high speed operation with allowable noise. When the power supply $V_{CC}$ is at 5 volts, the 5VSYS signal enables the compensation circuit in each of output buffers 5353n to lower the noise to the allowable range for the high speed operation.

The 5VSYS signal is also used to control flash algorithm control engine 51b to select and modify the programming and erasure algorithm in accordance with the power supply voltage $V_{CC}$ such that the programming and erasure operations of flash EPROM 20 is independent of the power supply voltage $V_{CC}$. As described above, flash algorithm control engine 51b controls flash EPROM 20 during the programming and erasure operations. Control engine 51b sets the programming and erasure pulses in accordance with the flash algorithm it currently adopts to maximize performance and device reliability. The width of the pulses is determined by counting pulses of an oscillator (not shown) of control engine 51b.

The frequency of the oscillator, however, varies with respect to the voltage level of the power supply voltage $V_{CC}$. This means that the pulse width of the pulses generated by control engine 51b will be shorter for a 5 volt power supply than that for a 3.3 volt power supply when other conditions of the system are unchanged. In order to make the pulse width of the pulses generated by control engine 51b independent of the power supply voltage $V_{CC}$, the number of the counted pulses generated by the oscillator must be changed in accordance with the change in the voltage level of the power supply voltage $V_{CC}$. This is done by applying the 5VSYS signal to control engine 51b to select the respective algorithm to control the oscillator pulses counted for the respective power supply voltage $V_{CC}$.

As described above, flash algorithm control engine 51b is a synchronous system while the 5VSYS signal is not a synchronized signal. As also described above, latch 51a is used to synchronize the 5VSYS signal to become the LATCH5VSYS signal.

The 5VSYS signal is also applied to boost circuit 32 via an inverter 50. The 5VSYS signal controls boost circuit 32 to be enabled during the read operation to boost the power supply voltage $V_{CC}$ to the $V_{PX}$ voltage when the $V_{CC}$ is at 3.3 volts. The $V_{PX}$ voltage is at 5 volts. When the power supply voltage $V_{CC}$ is at 5 volts, the 5VSYS signal does not enable boost circuit 32 to generate the $V_{PX}$ voltage and the $V_{CC}$ voltage is directly applied to the selected word line of memory array 21 via X decoder 22. In this situation, the output of boost circuit 32 is left floating. The circuit of boosts circuit 32 can be any type of boost circuit known in the art. The 5VSYS signal is only applied to boost circuit 32 to enable or disable the circuit.

Configuration logic 31 generates the 5VSYS signal in accordance with the 3/5PIN signal and the $CAM_1$ and $CAM_2$ signals. As described above, the 3/5PIN signal indicates the voltage level of the power supply $V_{CC}$ and the $CAM_1$ and $CAM_2$ signals control configuration logic 31 to operate with respect to the 3/5PIN signal.

For example, when the CAM$_1$ and CAM$_2$ signals indicate a first configuration state in which flash EPROM 210 should be a 5 volt flash EPROM, configuration logic 31 is controlled to generate the 5VSYS signal that controls control circuitry 30 and boost circuit 32 to operate at the 5 volt power supply only, regardless of the 3/$\overline{5}$PIN signal.

When the CAM$_1$ and CAM$_2$ signals indicate a second configuration state in which flash EPROM 20 should be a 3.3 volt flash EPROM, configuration logic 31 is controlled to generate the 5VSYS signal that controls control circuitry 30 and boost circuit 32 to operate at the 3.3 volt power supply only, regardless of the 3/$\overline{5}$PIN signal.

Figure 3:
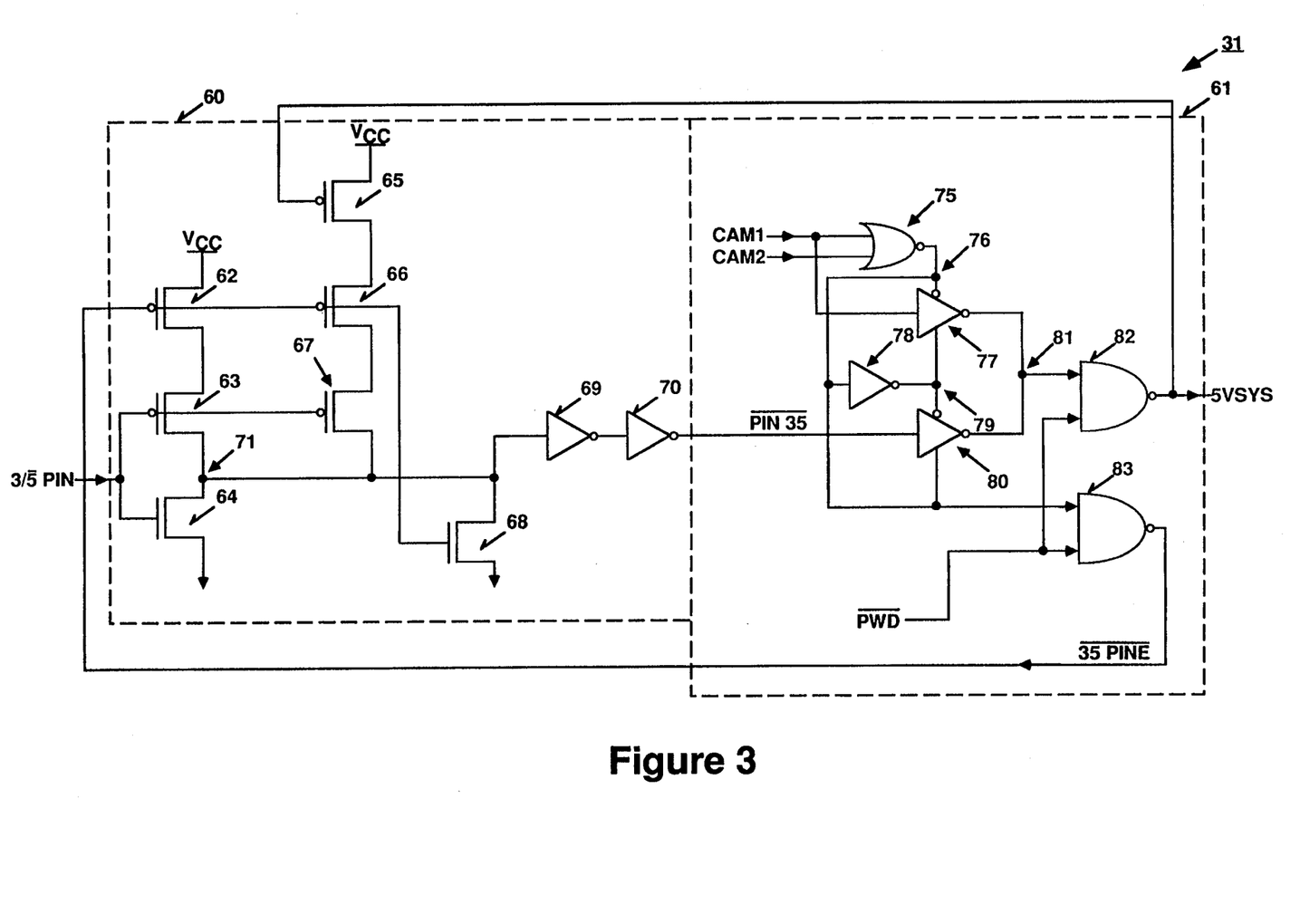
FIG. 3 is a circuit diagram of the configuration logic of FIG. 2.
Figure 7:
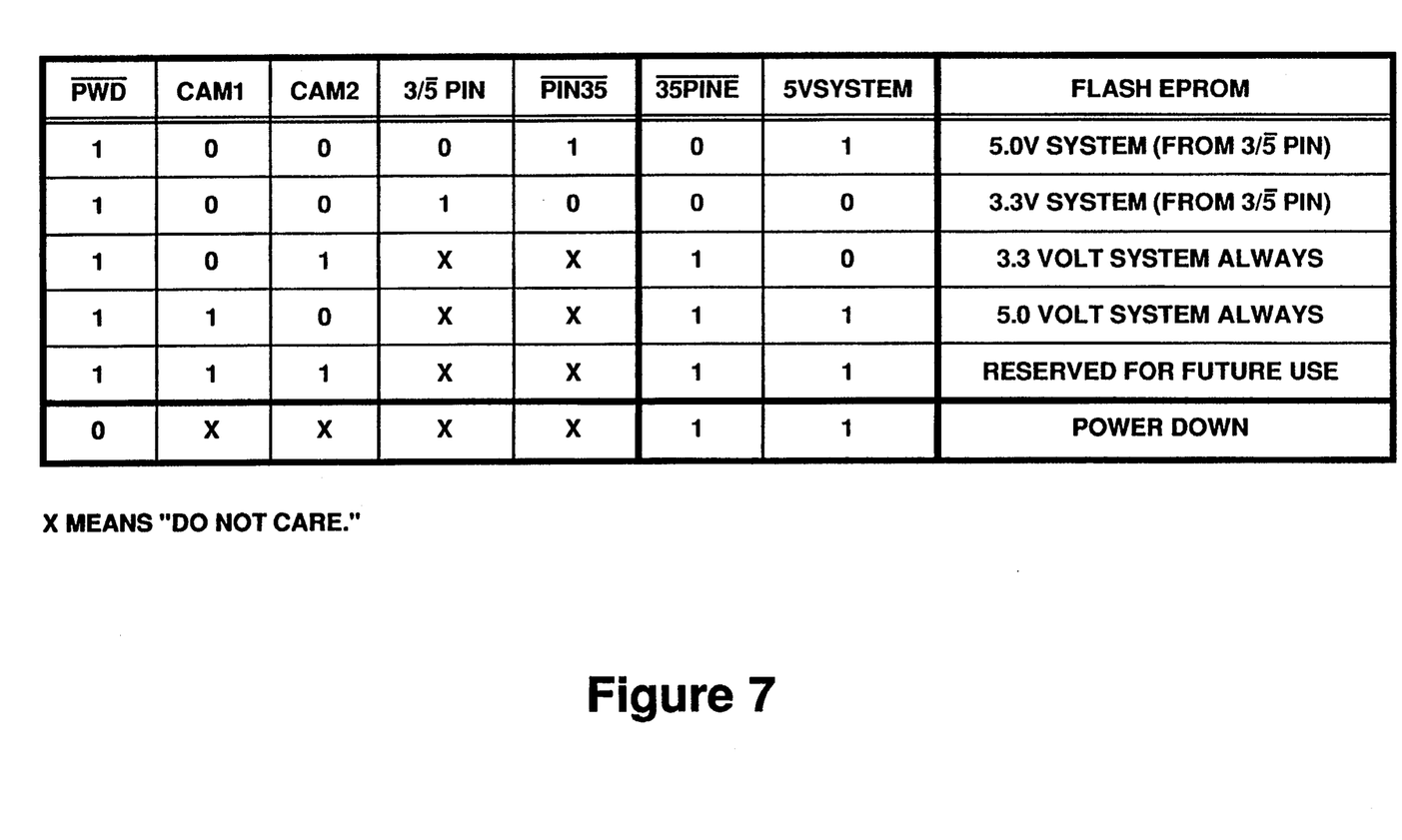
FIG. 7 is a logic truth table showing the relation of the 3/5PIN, $CAM_1$, $CAM_2$, $\overline{PIN35}$, $\overline{35PINE}$, and 5VSYS signals illustrated in FIG. 3.

When the CAM$_1$ and CAM$_2$ signals indicate a third configuration state in which flash EPROM 20 is allowed to be configured in accordance with the 3/$\overline{5}$PIN signal, configuration logic 31 then generates the 5VSYS signal in accordance with the 3/$\overline{5}$PIN signal. The circuit of configuration logic 31 is shown in FIG. 3, which will be described in more detail below. The relationship of the 5VSYS with respect to the 3/$\overline{5}$PIN, CAM$_1$, CAM$_2$, and $\overline{PWD}$ signals is shown in FIG. 7, which will also be described in more detail below.

FIG. 3 illustrates the circuit of configuration logic 31 of FIGS. 1–2. As can be seen from FIG. 3, configuration logic 31 includes an input buffer 60 and a logic 61. Input buffer 60 is connected to receive the 3/$\overline{5}$PIN signal from the 3/$\overline{5}$pin. Input buffer 60 outputs a $\overline{PIN35}$ signal to logic 61. Logic 61 outputs the power supply configuration signal 5VSYS and a $\overline{35PINE}$ signal. The 5VSYS and $\overline{35PINE}$ signals are also fed to input buffer 60.

Input buffer 60 includes transistors 62 through 68. Transistors 62-63 and 65-67 are P-channel transistors and transistors 64 and 68 are N-channel transistors. Transistors 62-64 form a standard input buffer. The ratio of the device size between transistors 63 and 64 determines the trip point of input buffer 60. The trip point is the threshold voltage level at which the output of input buffer 60 flips. Process parameters, device sizes, and power supply voltage V$_{CC}$ all affect the trip point. For a TTL input signal, the trip point of input buffer 60 is required to between 0.8 volts and 2.0 volts. For one embodiment, the trip point is set at 1.4 volts.

As the voltage level of the V$_{CC}$ power supply voltage changes, the trip point of input buffer 60 changes accordingly. Therefore, the ratio of the device size between transistors 63 and 64 is set such that the trip point of input buffer 60 is set at 1.4 volts when the power supply V$_{CC}$ voltage is at 5 volts.

When the voltage level of the power supply voltage V$_{CC}$ drops to 3.3 volts, the trip point of input buffer 60 drops below the required minimum trip point voltage. At this time, if the device size of transistor 63 is increased, the trip point of input buffer 60 will increase accordingly. This is done by connecting transistor 67 in parallel with transistor 63. The 5VSYS signal does this by turning on transistor 65 when the V$_{CC}$ voltage is at 3.3 volts. Transistors 62, 66, and 68 are switching transistors that, when turned off by the $\overline{35PINE}$ signal, switch off the power supply of input buffer 60 and ground the output of input buffer 60. In other words, when the $\overline{35PINE}$ signal is logically high, input buffer 60 is disabled. When the $\overline{35PINE}$ signal is logically low, input buffer 60 is enabled.

Logic 61 receives the $\overline{PIN35}$ signal from input buffer 60. Logic 61 also receives the CAM$_1$ and CAM$_2$ signals from configuration cells 33 of FIG. 1. In addition, the PWD power down control signal is applied to logic 61. Logic 61 outputs the 5VSYS signal which is the power supply configuration control signal for flash EPROM 20. Logic 61 also outputs the $\overline{35PINE}$ signal which is the input buffer enable signal for input buffer 60.

The CAM$_1$ and CAM$_2$ signals are supplied to a NOR gate 75. The output of NOR gate 75 is used to enable tri-state inverter 77 and tri-state inverter 80 via inverter 78. The CAM$_1$ signal is also applied to tri-state inverter 77. The $\overline{PIN35}$ signal is applied to tri-state inverter 80. Tri-state inverters 77 and 80 are alternately enabled to receive their respective input signals. The outputs of tri-state inverters 77 and 80 are combined at node 81 as an input to NAND gate 82. NAND gate 82 outputs the 5VSYS signal. The output of NOR gate 75 is also applied to an NAND gate 83 as an input. The other input of NAND gates 82-83 is the $\overline{PWD}$ signal. NAND gate 83 outputs the input buffer enable $\overline{35PINE}$ signal.

The function of configuration logic 31 is now described below, in conjunction with FIG. 7. FIG. 7 is the truth table that shows the relationship of the 3/$\overline{5}$PIN, $\overline{PIN35}$, $\overline{PWD}$, CAM$_1$, CAM$_2$, 5VSYS, and $\overline{35PINE}$ signals of FIG. 3. Referring now to FIGS. 3 and 7, when the $\overline{PWD}$ signal is logically high, flash EPROM 20 is in normal operational modes. When the CAM$_1$ and CAM$_2$ signals are not both logically low, NOR gate 75 outputs a logically low signal that causes the $\overline{35PINE}$ signal to be logically high. The logically high $\overline{35PINE}$ signal disables input buffer 60 from receiving the 3/$\overline{5}$PIN signal. In addition, the logically low signal at the output of NOR gate 75 enables tri-state inverter 77 and disables tri-state inverter 80. At this time, the 5VSYS signal depends on the CAM$_1$ signal. When the CAM$_1$ signal is logically low, the 5VSYS signal is logically low. When the CAM$_1$ signal is logically high, the 5VSYS signal is logically high. As described above, a logically high 5VSYS signal configures flash EPROM 20 to be a 5 volt flash EPROM only. A logically low 5VSYS signal configures flash EPROM 20 to be a 3.3 volt flash EPROM only. Therefore, configuration cells 33 of FIG. 1 provide a mechanism for flash EPROM 20 to be configured to a single power supply flash EPROM. When both the CAM$_1$ and CAM$_2$ signals are logically high which state is reserved for future use, flash EPROM 20 is default to the 5 volts flash EPROM.

When both the CAM$_1$ and CAM$_2$ signals are logically low, NOR gate 75 outputs a logical high signal which causes the $\overline{35PINE}$ signal to be logically low. The logical low $\overline{35PINE}$ signal enables input buffer 70. Meanwhile, the logical high signal at the output of NOR gate 75 disables inverter 77 and enables tri-state inverter 80.

When the power supply VCC voltages applied to flash EPROM 20 is 5 volts, the 3/$\overline{5}$PIN signal is logically low. The logically low 3/$\overline{5}$PIN signal causes the $\overline{PIN35}$ signal to be logically high, no matter whether transistor 67 is electrically connected in parallel to transistor 63 (the 3$\overline{5}$PIN signal usually is a CMOS level logical signal). The logical high $\overline{PIN35}$ signal then causes the 5VSYS signal to be logically high. The logical high 5VSYS signal causes transistor 65 to be turned off that disconnects transistor 67 from the circuit of input buffer 60. This causes the trip point of input buffer 60 to be determined by transistors 63-64 only.

When the power supply V$_{CC}$ voltage applied to flash EPROM 20 is 3.3 volts, the 3/$\overline{5}$PIN signal is logically high. This causes the $\overline{PIN35}$ signal to be logically low. The logical low $\overline{PIN35}$ signal then causes the 5VSYS signal to be logically low, turning on transistor 65. This causes transistor 67 to be electrically connected in parallel with transistor 63. This has the effect of increasing the device size of transistor 63 which in turn increases the trip point when the power supply voltage $V_{CC}$ is low.

When the $\overline{PWD}$ signal is logically low, NAND gates 82-83 are blocked by the logical low $\overline{PWD}$ signal and input buffer 60 is disabled and flash EPROM 20 is defaulted to the 5 volt flash EPROM.

Figure 4:
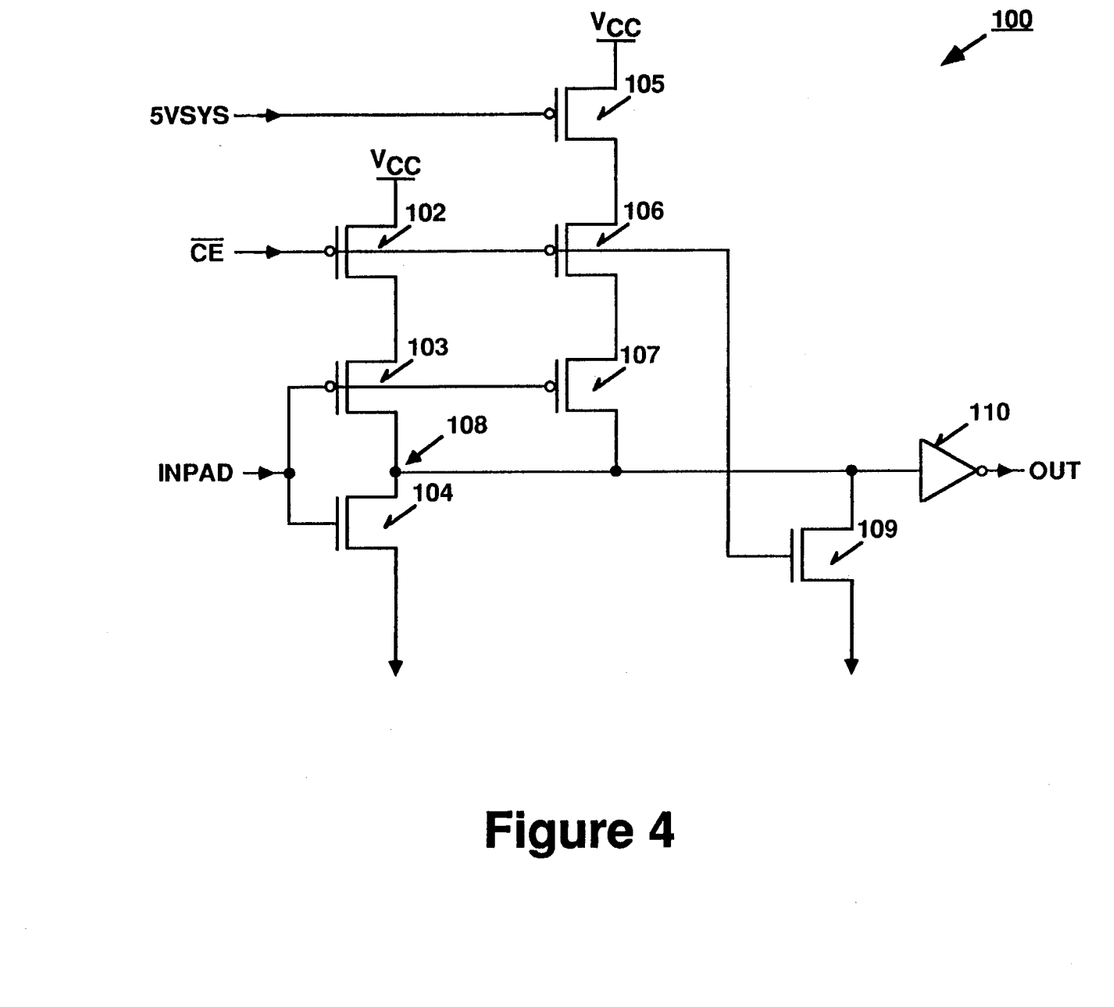
FIG. 4 is a circuit diagram of one of the input buffers of FIG. 2.

Referring to FIG. 4, the circuit of an input buffer 100 is shown. Input buffer 100 of FIG. 4 represents the circuit of each of input buffers 52-52n of FIG. 2. As also can be seen from FIGS. 3 and 4 input buffer 100 has the same circuit as that of input buffer 60 of FIG. 4.

Input buffer 100 receives the 5VSYS signal, the $\overline{CE}$ signal, and the INPAD signal. The INPAD signal is the pin signal which represents one of the $PIN_1$ through $PIN_n$ signals of FIG. 2. The $\overline{CE}$ signal is the chip enable signal of flash EPROM 20 (FIG. 1) that is used to switch off input buffer 100 when flash EPROM 20 is not enabled.

The 5VSYS signal controls input buffer 100 to select a device size ratio for the trip point. When the 5VSYS signal turns on transistor 105, the trip point of input buffer 100 is determined by transistors 103-104 and 107. When the 5VSYS signal turns off transistor 105, the trip point of input buffer is determined by transistors 103-104.

For alternative embodiments, many more branches, like the branch formed by transistors 105-107, can be connected between the power supply $V_{CC}$ and node 108 such that input buffer 100 can have more than two ratios for the trip point, each for one power supply voltage $V_{CC}$.

Figure 5:
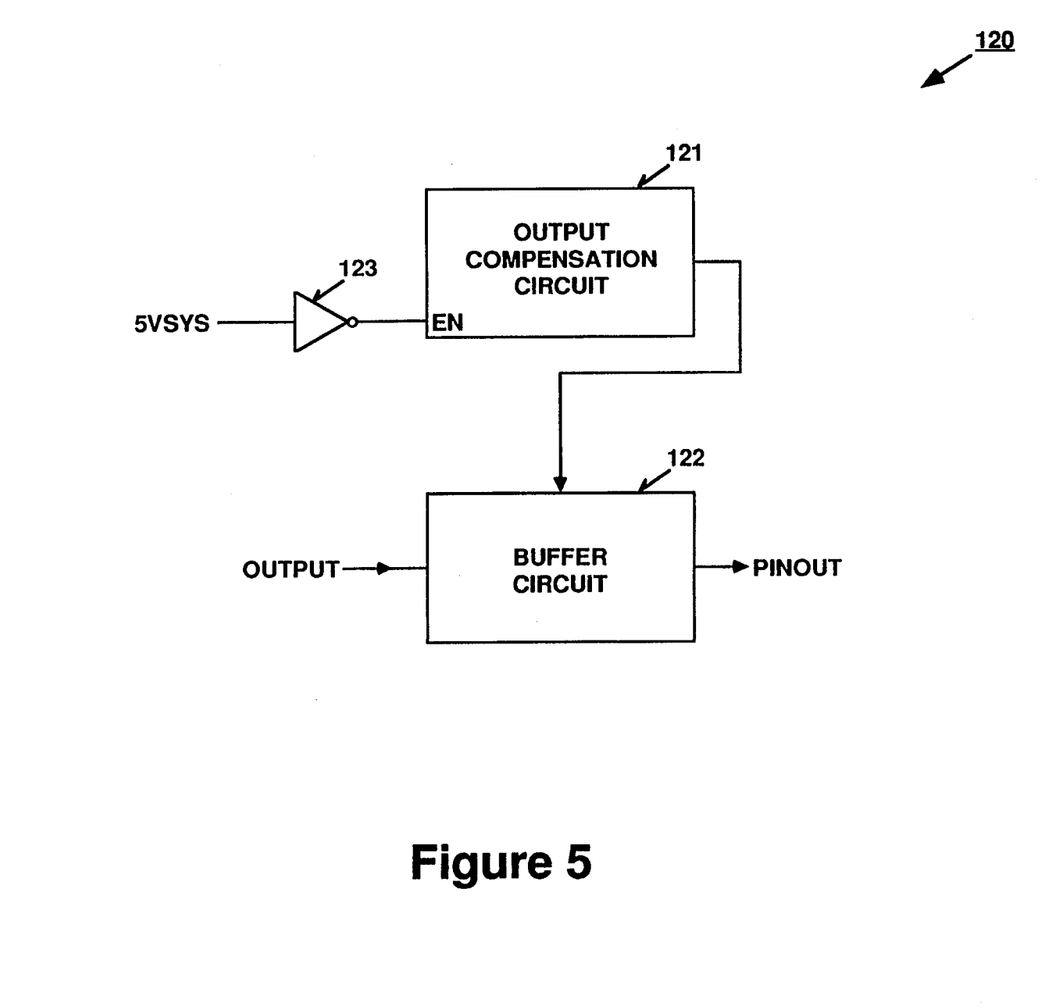
FIG. 5 is a block diagram of a block diagram of one of the output buffers of FIG. 2.

Referring to FIG. 5, a block diagram of an output buffer 120 is shown that includes an output compensation circuit 121 and a buffer circuit 122. Output buffer 120 of FIG. 5 represents the circuit of each of output buffers 53-53n of FIG. 2.

As described above, compensation circuit 121 is used in output buffer 120 to lower the noise level when the power supply voltage $V_{CC}$ is at 5 volts. When the $V_{CC}$ voltage is at 3.3 volts, compensation circuit 121 is not needed and can be disabled. The 5VSYS signal is used to enable compensation circuit 1 21 when the $V_{CC}$ voltage is at 5 volts and to disable compensation circuit 121 when the $V_{CC}$ voltage is at 3.3 volts. The circuit of output compensation circuit 121 can be any type of compensation circuit known in the art. Buffer circuit 122 can also be any type of buffer circuit known in the art. The 5VSYS signal only enables or disables compensation circuit 121.

Figure 6:
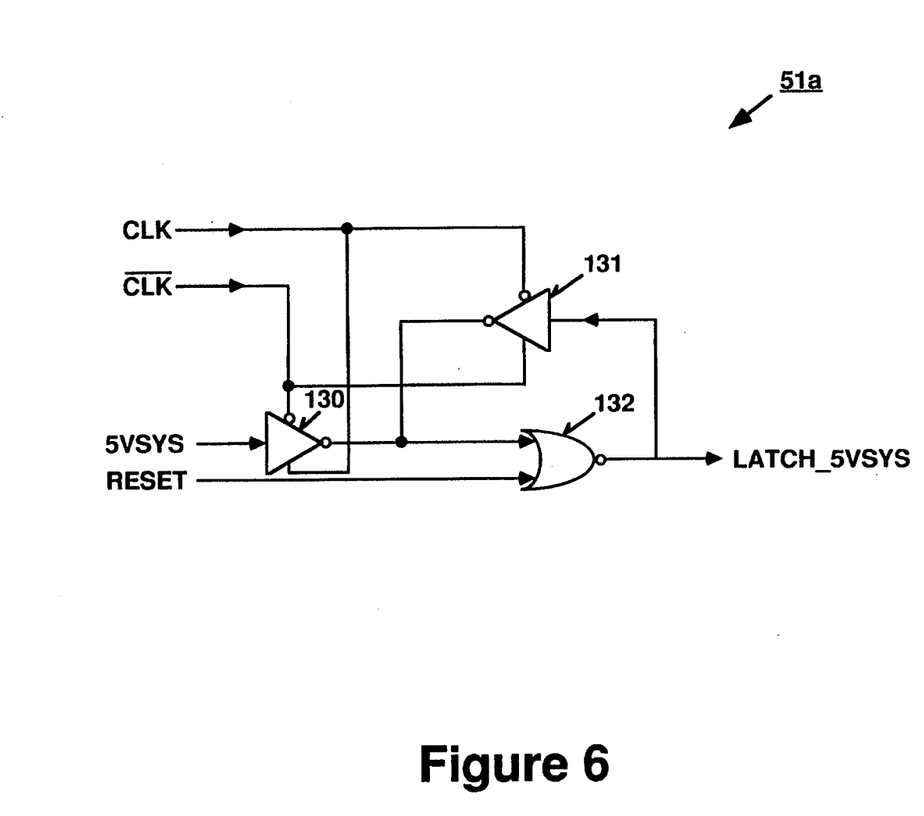
FIG. 6 is a circuit diagram of a latch circuit of a flash algorithm control circuit of the control circuitry of FIG. 2.

Referring to FIG. 6, latch 51a is shown which includes tri-state inverters 130 and 1 31. As described above, latch 51 a is used to synchronize the 5VSYS signal with the CLK signal. Tri-state inverters 130 and 131 are controlled by the CLK signal to be alternately enabled. When tri-state inverter 130 is enabled, the 5VSYS signal is applied to an NOR gate 132. When tri-state inverter 1 31 is enabled and tri-state inverter 130 is disabled, the output of NOR gate 132 is held by the feedback path of tri-state inverter 1 31. In this way, the 5VSYS signal is synchronized with the CLK signal in latch 51a.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory, comprising:
   (A) a memory array;
   (B) control circuitry having a boost circuit and coupled to the memory array for controlling memory operations with respect to the memory array, wherein the control circuitry can operate at either a first power supply voltage or a second power supply voltage;
   (C) a power supply configuration circuit coupled to receive a power supply voltage indication signal for selectively configuring the control circuitry in accordance with the power supply indication signal to operate at one of the first and second power supply voltages that is applied to the control circuitry, wherein when the power supply voltage indication signal is in a first state, the configuration circuit configures the control circuitry to operate at the first power supply voltage, wherein when the power supply voltage indication signal is in a second state, the configuration circuit figures the control circuitry to operate at the second power supply voltage;
   (D) an input pin coupled to the configuration circuit for receiving the power supply voltage indication signal and for applying the power supply voltage indication signal to the configuration circuit;
   (E) a detection circuit for determining which one of the first and second power supply voltages is applied to the nonvolatile memory and for generating the power supply voltage indication signal accordingly, wherein when the detection circuit determines that the first power supply voltage is applied to the nonvolatile memory, the power supply voltage indication signal generated by the detection circuit is in the first state, wherein when the detection circuit determines that the second power supply voltage is applied to the nonvolatile memory, the power supply voltage indication signal generated by the detection circuit is in the second state.

2. A nonvolatile memory, comprising;
   (A) a memory array;
   (B) control circuitry coupled to the memory array for controlling memory operations with respect to the memory array, wherein the control circuitry can operate at either a first power supply voltage or a second power supply voltage:
   (C) a power supply configuration circuit coupled to receive a power supply voltage indication signal for selectively configuring the control circuitry in accordance with the power supply indication signal to operate at one of the first and second power supply voltages that is applied to the control circuitry, wherein when the power supply voltage indication signal is in a first state. the configuration circuit configures the control circuitry to operate at the first power supply voltage, wherein when the power supply voltage indication signal is in a second state, the configuration circuit configures the control circuitry to operate at the second power supply voltage:
   (D) an input pin coupled to the configuration circuit for receiving the power supply voltage indication signal from an external circuit and for applying the power supply voltage indication signal to the configuration circuit;

wherein the control circuitry further comprises (i) a plurality of input buffers, each having a first device size ratio for a trip DO. jet associated with the first power supply voltage and a second device size ratio for the trip point associated with the second power supply voltage;

(ii) a plurality of output buffers, each having an output compensation circuit;

(iii) a boost circuit coupled to a selected word line of the memory array via a decoder;

(iv) a memory operation control engine for controlling the memory operations with respect to the memory array, wherein the memory operation control engine includes a first memory operation control algorithm associated with the first power supply voltage and a second memory operation control algorithm associated with the second power supply voltage, wherein when the power supply voltage indication signal is in the first state, the configuration circuit (1) causes each of the plurality of input buffers to have the first device size ratio, (2) disables the output compensation circuit in each of the plurality of output buffers, (3) causes the boost circuit to boost the first power supply voltage applied to the selected word line of the memory array during a read operation to the second power supply voltage, and (4) causes the memory operation control engine to select the first memory operation control algorithm, wherein when the power supply voltage indication signal is in the second state, the configuration circuit (5) causes each of the plurality of input buffers to have the second device size ratio, (6) enables the output compensation circuit in each of the plurality of output buffers, (7) disables the boost circuit, and (8) causes the memory operation control engine to select the second memory operation control algorithm.

3. A nonvolatile memory, comprising;

(A) a memory array:

(B) control circuitry having a boost circuit and coupled to the memory array for controlling memory operations with respect to the memory array. wherein the control circuitry can operate at either a first power supply voltage or a second power supply voltage:

(C) a power supply configuration circuit coupled to receive a power supply voltage indication signal for selectively configuring the control circuitry in accordance with the power supply indication signal to at one and second power supply voltages that is applied to the control circuitry, wherein when the power supply voltage indication signal is in a first state. the configuration circuit configures the control circuitry to operate at the first power supply voltage, wherein when the power supply voltage indication signal is in a second state, the configuration circuit configuration to control circuitry to operate at the second power supply voltage;

(D) an input pin coupled to the configuration circuit for receiving the power supply voltage indication signal from an external circuit and for applying the power supply voltage indication signal to the configuration circuit;

(E) a configuration memory coupled to the configuration circuit for storing configuration information to configure the configuration circuit to operate with respect to the power supply voltage indication signal, wherein the configuration memory can be in a first configuration state, a second configuration state, and a third configuration state, wherein when the configuration memory is in the first configuration state, the configuration circuit configures the control circuitry to operate in accordance with the power supply voltage indication signal, wherein when the configuration memory is in the second configuration state, the configuration circuit configures the control circuitry to operate at the first power supply voltage regardless of the power supply voltage indication signal, wherein when the configuration memory is in the third configuration state, the configuration circuit configures the control circuitry to operate at the second power supply voltage regardless of the power supply voltage indication signal.

4. The nonvolatile memory of claim 1, wherein the first power supply voltage is approximately 5 volts and the second power supply voltage is approximately 3.3 volts.

5. The nonvolatile memory of claim 1, wherein the nonvolatile memory includes memory cells that are electrically programmable and erasable.

6. The nonvolatile memory of claim 1, wherein the control circuitry can operate at a plurality of power supply voltages, including the first and second power supply voltages, wherein the configuration circuit can configure the control circuitry to operate at one of the plurality of power supply voltages at one time.

7. A nonvolatile memory, comprising:

(A) a memory array;

(B) control circuitry coupled to the memory array for controlling memory operations with respect to the memory array, wherein the control circuitry can operate at either a first power supply voltage or a second power supply voltage, wherein the control circuitry further comprises (i) a plurality of input buffers, each having a first device size ratio for a trip point associated with the first power supply voltage and a second device size ratio for the trip point associated with the second power supply voltage;

(ii) a plurality of output buffers, each having an output compensation circuit;

(iii) a boost circuit coupled to a selected word line of the memory array via a decoder;

(iv) a memory operation control engine for controlling the memory operations with respect to the memory array, wherein the memory operation control engine includes a first memory operation control algorithm associated with the first power supply voltage and a second memory operation control algorithm associated with the second power supply voltage;

(C) a configuration circuit coupled to receive a power supply voltage indication signal for selectively configuring the control circuitry in accordance with the power supply voltage indication signal to operate at one of the first and second power supply voltages that is applied to the control circuitry, wherein when the power supply voltage indication signal is in a first state, the configuration circuit (1) causes each of the plurality of input buffers to have the first device size ratio, (2) disables the output compensation circuit in each of the plurality of output buffers, (3) causes the boost circuit to boost the first power supply voltage applied to the selected word line of the memory array during a read operation to the second power supply voltage, and (4) causes the memory operation control engine to select the first memory operation control algorithm, wherein when the power supply voltage indication signal is in a second state, the configuration circuit (5) causes each of the plurality of input buffers to have the second device size ratio, (6) enables the output compensation circuit in each of the plurality of output buffers, (7) disables the boost circuit, and (8) causes the memory operation control engine to select the second memory operation control algorithm.

8. The nonvolatile memory of claim 7, further comprising an input pin coupled to the configuration circuit for receiving the power supply voltage indication signal from an external circuit and for applying the power supply voltage indication signal to the configuration circuit.

9. The nonvolatile memory of claim 7, further comprising a detection circuit for determining which one of the first and second power supply voltages is applied to the nonvolatile memory and for generating the power supply voltage indication signal accordingly, wherein when the detection circuit determines that the first power supply voltage is applied to the nonvolatile memory, the power supply indication signal generated by the detection circuit is in the first state, wherein when the detection circuit determines that the second power supply voltage is applied to the nonvolatile memory, the power supply voltage indication signal generated by the detection circuit is in the second state.

10. The nonvolatile memory of claim 7, further comprising a configuration memory coupled to the configuration circuit for storing configuration information to configure the configuration circuit to operate with respect to the power supply voltage indication signal, wherein the configuration memory can be in a first configuration state, a second configuration state, and a third configuration state, wherein when the configuration memory is in the first configuration state, the configuration circuit configures the control circuitry to operate in accordance with the power supply voltage indication signal, wherein when the configuration memory is in the second configuration state, the configuration circuit configures the control circuitry to operate at the first power supply voltage regardless of the power supply voltage indication signal, wherein when the configuration memory is in the third configuration state, the configuration circuit configures the control circuitry to operate at the second power supply voltage regardless of the power supply voltage indication signal.

11. The nonvolatile memory of claim 7, wherein the first power supply voltage is approximately 5 volts and the second power supply voltage is approximately 3.3 volts.

12. The nonvolatile memory of claim 7, wherein the nonvolatile memory includes memory cells that are electrically programmable and erasable.

13. The nonvolatile memory of claim 7, wherein the control circuitry can operate at a plurality of power supply voltages, including the first and second power supply voltages, wherein the configuration circuit can configure the control circuitry to operate at one of the plurality of power supply voltages at one time.

14. A method for automatically configuring a nonvolatile memory with respect to the voltage level of a power supply applied to the nonvolatile memory in accordance with a power supply voltage indication signal, wherein the power supply can be in either a first voltage level or a second voltage level, wherein the method comprises the steps of:

(a) receiving the power supply voltage indication signal in a configuration circuit, wherein the power supply voltage indication signal indicates the voltage level of the power supply applied to the nonvolatile memory, wherein the power supply voltage indication signal is in a first state when the power supply has the first voltage level and is in a second state when the power supply has the second voltage level;

(b) configuring the nonvolatile memory by the configuration circuit in accordance with the power supply voltage indication signal to operate at one of the first and second voltage levels of the power supply applied to the control circuitry, wherein when the power supply voltage indication signal is in the first state, then (i) causing each of a plurality of input buffers of the control circuitry to have a first device size ratio for a trip point that is associated with the first voltage level of the power supply;

(ii) causing an output compensation circuit in each of a plurality of output buffers of the control circuitry to be disabled;

(iii) causing a boost circuit of the control circuitry to boost the first voltage level of the power supply applied to a selected word line of the memory array during a read operation to the second voltage level;

(iv) causing a memory operation control engine of the control circuitry to select a first memory operation control algorithm associated with the first voltage level of the power supply;

wherein when the power supply voltage indication signal is in the second state, then (v) causing each of the plurality of input buffers of the control circuitry to have a second device size ratio for the trip point that is associated with the second voltage level of the power supply;

(vi) causing the output compensation circuit in each of the plurality of output buffers of the control circuitry to be enabled;

(vii) causing the boost circuit of the control circuitry to be disabled;

(viii) causing the memory operation control engine of the control circuitry to select a second memory operation control algorithm associated with the second voltage level of the power supply.

15. The method of claim 14, further comprising the steps of:

(A) detecting the voltage level of the power supply applied to the nonvolatile memory;

(B) generating the power supply voltage indication signal in accordance with the voltage level detected, wherein when the power supply is detected to have the first voltage level, the power supply voltage indication signal generated is in the first state, wherein when the power supply is detected to have the second voltage level, the power supply voltage indication signal generated is in the second state.

16. The method of claim 14, wherein the configuration circuit receives the power supply voltage indication signal from an external circuit via an input pin of the nonvolatile memory.

17. The method of claim 14, wherein the nonvolatile memory includes memory cells that are electrically programmable and erasable.

18. The method of claim 14, wherein the first voltage level is approximately 5 volts and the second voltage level is approximately 3.3 volts.

* * * * *

UNITED STATES PATENT AND TRADEMARK OFFICE
CERTIFICATE OF CORRECTION

PATENT NO. : 5,363,335
DATED : November 8, 1994
INVENTOR(S) : Jungroth et al.

It is certified that error appears in the above-indentified patent and that said Letters Patent is hereby corrected as shown below:

In column 3 at line 35 delete "("Megabytes")" and insert --("Megabits")--

In column 5 at line 17 delete "LATCH5VSYS" and insert --LATCH_5VSYS--

In column 5 at line 18 delete "LATCH5VSYS" and insert --LATCH_5VSYS--

In column 5 at line 31 delete "LATCH5VSYS" and insert --LATCH_5VSYS--

In column 5 at line 32 delete "LATCH-5VSYS" and insert --LATCH5VSYS--

In column 5 at line 34 delete "LATCH5VSYS" and insert --LATCH_5VSYS--

In column 5 at line 55 delete "PWD" and insert --$\overline{PWD}$--

In column 6 at line 38 delete "VCC" and insert --$V_{CC}$--

In column 6 at line 49 delete "ERPOM 20" and insert --EPROM 20--

In column 6 at line 53 delete "PROM 20" and insert --EPROM 20--

In column 7 at line 56 delete "VCC" and insert --$V_{CC}$--

UNITED STATES PATENT AND TRADEMARK OFFICE
CERTIFICATE OF CORRECTION

PATENT NO. : 5,363,335
DATED : November 8, 1994
INVENTOR(S) : Jungroth et al.

It is certified that error appears in the above-indentified patent and that said Letters Patent is hereby corrected as shown below:

In column 8 at line 48 delete "LATCH5VSYS" and insert --LATCH_5VSYS--

In column 10 at line 2 delete "PWD" and insert --$\overline{PWD}$--

In column 10 at line 53 delete "VCC" and insert --V$_{CC}$--

In column 10 at line 58 delete "35PIN" and insert --$\overline{3}$/$\overline{5}$PIN--

In column 11 at line 56 delete "51" and insert --51a--

In column 12 at line 26 delete "figures" and insert --configures--

In column 13 at line 6 delete "DO. jet" and insert --point--

In column 13 at line 54 delete "at one" and insert --operate at one of the first--

In column 13 at line 61 delete "configuration to" and insert --configures the--

UNITED STATES PATENT AND TRADEMARK OFFICE
CERTIFICATE OF CORRECTION

PATENT NO. : 5,363,335
DATED : November 8, 1994
INVENTOR(S) : Jungroth et al.

It is certified that error appears in the above-indentified patent and that said Letters Patent is hereby corrected as shown below:

In column 8 at line 13 delete "5353n" and insert --53-53n--

Signed and Sealed this

Twenty-ninth Day of October 1996

Attest:

BRUCE LEHMAN

*Attesting Officer*　　　*Commissioner of Patents and Trademarks*